(12) United States Patent
Wan et al.

(10) Patent No.: US 9,797,659 B2
(45) Date of Patent: Oct. 24, 2017

(54) REFRIGERANT HEAT DISSIPATING APPARATUS

(71) Applicant: MAN ZAI INDUSTRIAL CO., LTD., Tainan (TW)

(72) Inventors: Cheng-Chien Wan, Tainan (TW); Cheng-Feng Wan, Tainan (TW); Hao-Hui Lin, Tainan (TW)

(73) Assignee: MAN ZAI INDUSTRIAL CO., LTD., Tainan (TW)

( * ) Notice: Subject to any disclaimer, the term of this patent is extended or adjusted under 35 U.S.C. 154(b) by 36 days.

(21) Appl. No.: 15/157,918

(22) Filed: May 18, 2016

(65) Prior Publication Data

US 2016/0341488 A1 Nov. 24, 2016

(30) Foreign Application Priority Data

May 21, 2015 (TW) .............................. 104116203 A

(51) Int. Cl.
| | | |
|---|---|---|
| *F28D 15/00* | (2006.01) | |
| *F28D 15/02* | (2006.01) | |
| *H01L 23/427* | (2006.01) | |
| *F28D 21/00* | (2006.01) | |
| *H01L 23/367* | (2006.01) | |
| *H01L 23/467* | (2006.01) | |
| *F28D 1/053* | (2006.01) | |

(52) U.S. Cl.
CPC ....... *F28D 15/0266* (2013.01); *F28D 15/025* (2013.01); *H01L 23/427* (2013.01); *F28D 1/05366* (2013.01); *F28D 2021/0028* (2013.01); *H01L 23/3672* (2013.01); *H01L 23/467* (2013.01)

(58) Field of Classification Search
CPC ............... F28D 15/0266; F28D 15/025; F28D 1/05366; F28D 2021/0028; H01L 23/427; H01L 23/3672; H01L 23/467; H05K 7/20336; H05K 7/20318; H05K 7/20418
USPC ..................................................... 165/104.21
See application file for complete search history.

(56) References Cited

U.S. PATENT DOCUMENTS

| | | | | |
|---|---|---|---|---|
| 5,271,239 | A * | 12/1993 | Rockenfeller | C09K 5/047 165/80.2 |
| 6,840,311 | B2 * | 1/2005 | Ghosh | F28D 15/0233 165/104.33 |
| 7,665,511 | B2 * | 2/2010 | Bhatti | F28D 15/0266 165/104.33 |
| 2003/0042003 | A1 * | 3/2003 | Novotny | F25D 19/00 165/47 |

(Continued)

*Primary Examiner* — Davis Hwu
(74) *Attorney, Agent, or Firm* — Birch, Stewart, Kolasch & Birch, LLP

(57) ABSTRACT

A refrigerant heat dissipation apparatus has an evaporator, a condenser having a first condensing tube and a second condensing tube, a first refrigerant tube, two second refrigerant tubes, and a refrigerant. The first refrigerant tube is connected between the top of the evaporator and an upper part of a first condensing tube. The second refrigerant tubes are respectively connected with a lower part of the first condensing tube and a lower part of the second condensing tube, so as to form a multi-flow closed-loop cycle. The refrigerant is filled into the multi-flow closed-loop cycle. The controlling of cycling direction of the refrigerant achieves the efficiency in heat dissipating of the refrigerant heat dissipation apparatus.

2 Claims, 3 Drawing Sheets

(56) References Cited

U.S. PATENT DOCUMENTS

2008/0135224 A1\* 6/2008 Pun ..................... F24F 5/0035
165/247
2011/0114294 A1\* 5/2011 Degner ............... H01L 23/4006
165/104.26

\* cited by examiner

REFRIGERANT HEAT DISSIPATING APPARATUS

CROSS-REFERENCE TO RELATED APPLICATIONS

This application is based upon and claims priority under 35 U.S.C. 119 from Taiwan Patent Application No. 104116203 filed on May 21, 2015, which is hereby specifically incorporated herein by this reference thereto.

BACKGROUND

1. Technical Field

The present invention relates to a heat dissipating apparatus, and more particularly to a refrigerant heat dissipating apparatus.

2. Description of the Prior Art(s)

To avoid malfunction or damage of the electronic device under an elevated operating temperature, a heat dissipating apparatus is mounted at a heat source of the electronic device. The heat dissipating apparatus may quickly dissipate heat generated from the heat source and lower the temperature.

A conventional refrigerant heat dissipating apparatus for the electronic device is consisted of an evaporator, a condenser, and multiple refrigerant tubes connected in sequence between the evaporator and the condenser. The evaporator, the condenser, and the refrigerant tubes form a closed-loop cycle. After the refrigerant absorbs heat and is transformed into gas phase within the evaporator, the refrigerant flows toward the condenser via the refrigerant tubes. The refrigerant is cooled down and transformed into liquid phase within the condenser, and then flows back to the evaporator via the refrigerant tubes to absorb heat. Accordingly, by the gas-liquid transformation of the refrigerant and the closed-loop cycle, the heat dissipating apparatus provides a cooling mechanism for the heat source of the electronic device.

In the aforementioned refrigerant heat dissipating apparatus above, the closed-loop cycle is provided by the refrigerant tubes connected between the evaporator and the condenser. In another conventional refrigerant heat dissipating apparatus, a first refrigerant tube and a second refrigerant tube having the same inner diameter are connected with the top side and the bottom side of the evaporator respectively based on the principle that gas rises and liquid drops. The refrigerant in gaseous state may flow from the evaporator to the condenser under the conducting of the first refrigerant tube at the top side, and the refrigerant in liquid state may flow back to the evaporator from the condenser under the conducting of the second refrigerant tube at the bottom side.

However, as the first refrigerant tube and the second refrigerant tube have the same inner diameter and the evaporator has a large inner pressure, the refrigerant in gaseous state may flow to the condenser from the evaporator not only via the refrigerant tube at the top side, but also via the refrigerant at the bottom side. As such, the refrigerant does not flow in a specific cycling direction in the refrigerant heat dissipating apparatus.

In addition, the condenser comprises a first condensing tube, a second condensing tube, and a heat dissipating tube connected between the first condensing tube and the second condensing tube. The first condensing tube is connected with the first refrigerant tube. The second condensing tube is connected with the second refrigerant tube. The refrigerant in the evaporator has to pass through a long path to flow back to the evaporator. Specifically, the refrigerant flows from the evaporator and back to the evaporator via the first refrigerant tube, the first condensing tube, the heat dissipating tube, the second condensing tube, and the second refrigerant tube in sequence. Some of the refrigerant is transformed from gaseous state into liquid state when passing through the first refrigerant tube, and is not allowed to flow back to the evaporator for vaporizing without passing through the condenser and the second refrigerant tube, causing an insufficient heat dissipating efficiency in the refrigerant heat dissipating apparatus.

To overcome the shortcomings, a refrigerant heat dissipating apparatus to mitigate or obviate the aforementioned problems is provided.

SUMMARY

An objective of the present invention is to provide a refrigerant heat dissipating apparatus to overcome the technical limitation in controlling the cycling direction of the refrigerant and the heat dissipating efficiency.

In accordance with an embodiment, the refrigerant heat dissipation apparatus comprises:
  an evaporator comprising:
    a body;
    an evaporation chamber disposed within the body;
    a heat conducting element disposed at a bottom of the body;
    a refrigerant exit at a top of the body and communicating with the evaporation chamber; and
    two refrigerant entrances disposed at two side surfaces of the body respectively and communicating with the evaporation chamber, wherein the side surfaces are disposed at a height lower than the refrigerant exit and at two opposite sides of the refrigerant exit, and an entrance area of each of the refrigerant entrances is less than an exit area of the refrigerant exit;
  a condenser comprising:
    a first condensing tube and a second condensing tube arranged along a horizontal direction and spaced at an interval;
    multiple heat dissipating tubes arranged from top to down and connected between the first condensing tube and the second condensing tube; and
    multiple heat dissipating elements distributed on outer surfaces of the heat dissipating tubes and thermally contacting the outer surfaces of the heat dissipating tubes;
  a first refrigerant tube comprising two ends connected with the refrigerant exit and an upper part of the first condensing tube respectively;
  two second refrigerant tubes, each of the second refrigerant tubes comprising:
    an inner diameter less than an inner diameter of the first refrigerant tube;
    a first terminal connected with each of the refrigerant entrances; and
    a second terminal opposite to the first terminal, wherein the second terminals of the second refrigerant tubes are respectively connected with a lower part of the first condensing tube and a lower part of the second condensing tube, so as to form a multi-flow closed-loop cycle by the evaporator, the condenser, the first refrigerant tube and the second refrigerant tubes; and
  a refrigerant filled into the multi-flow closed-loop cycle.

The refrigerant may absorb heat in the evaporator and transform from liquid phase into gaseous phase. Since the entrance area of each of the refrigerant entrances is less than the exit area of the refrigerant exit and the inner diameter of each of the second refrigerant tubes is less than an inner diameter of the first refrigerant tube, the refrigerant in gaseous state may follow the principle that hot air rises and the Bernoulli's principle to flow from the evaporator to the condenser via the first refrigerant tube, and dissipate heat via the condenser.

The multi-flow closed-loop cycle is formed by connecting the second terminals of the second refrigerant tubes with the lower parts of the first condensing tube and the second condensing tube respectively. When the refrigerant in gaseous state flows from the evaporator to the first condensing tube via the first refrigerant tube, a part of the refrigerant in gaseous state may be transformed into liquid state and form a first refrigerant liquid flow. The first refrigerant liquid flow may flow down along the first condensing refrigerant tube and flow back to the evaporator via the second refrigerant tube connected with the first condensing tube for heat absorption. The rest of the refrigerant in gaseous state in the first condensing tube may flow into the second condensing tube via the heat dissipating tubes, be transformed into liquid state, and form a second refrigerant liquid flow in the second condensing tube. The second refrigerant liquid flow may flow down along the second condensing tube and flow back to the evaporator via the second refrigerant tube connected with the second condensing tube for heat absorption. Accordingly, the part of the refrigerant in gaseous state transformed into liquid state when passing through the first refrigerant tube is allowed to flow back to the evaporator without passing through the heat dissipating tubes and the second condensing tube in the multi-flow closed-loop cycle, thereby achieving a high heat dissipating efficiency of the refrigerant heat dissipating apparatus.

In accordance with an embodiment, each of the heat dissipating elements is a wavy sheet.

Other objectives, advantages, and novel features of the embodiments of the present invention will become more apparent from the following detailed description when taken in conjunction with the accompanying drawings.

DETAILED DESCRIPTION

Figure 1:
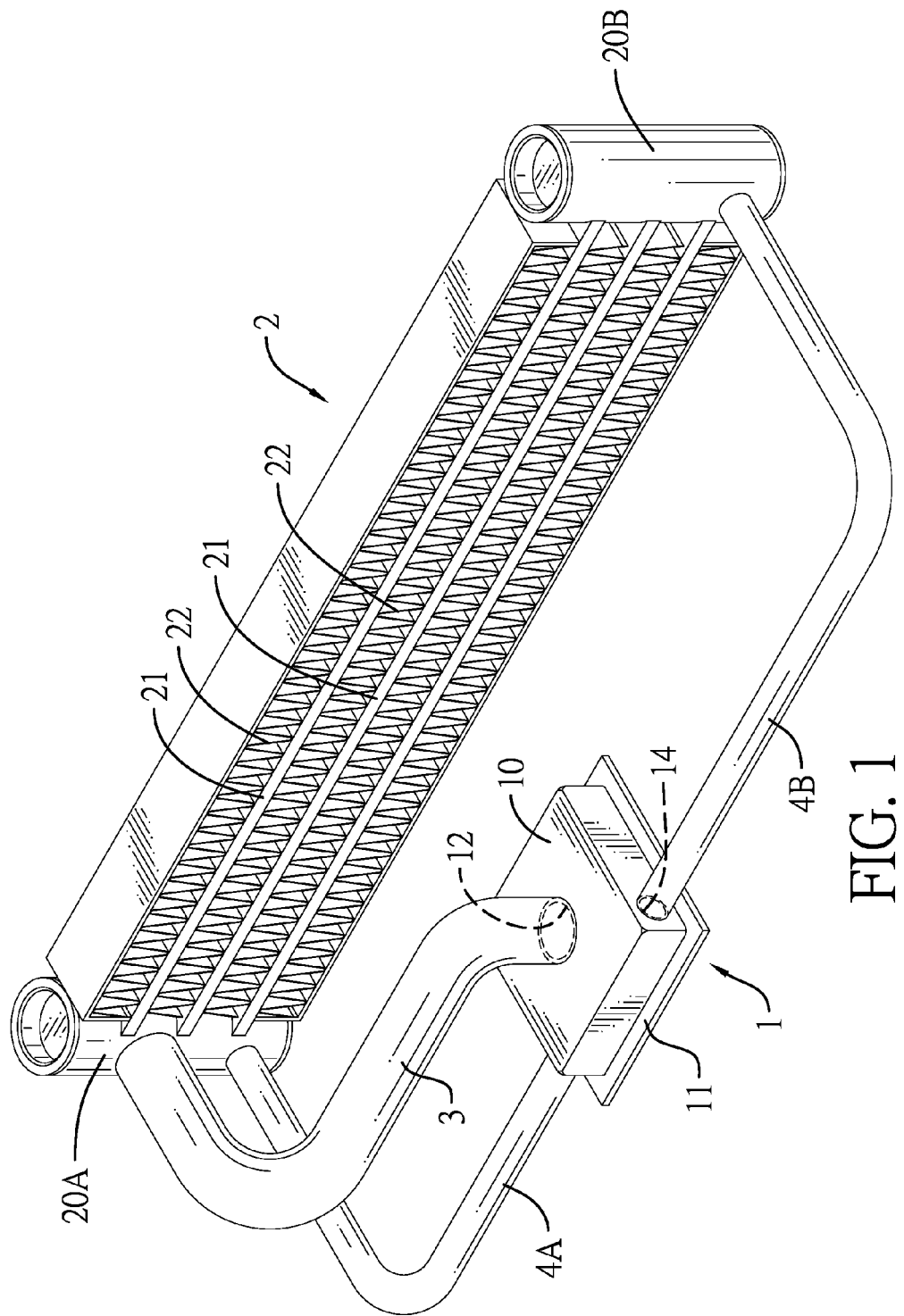
FIG. 1 is a perspective view of a refrigerant heat dissipating apparatus in accordance with the present invention.
Figure 2:
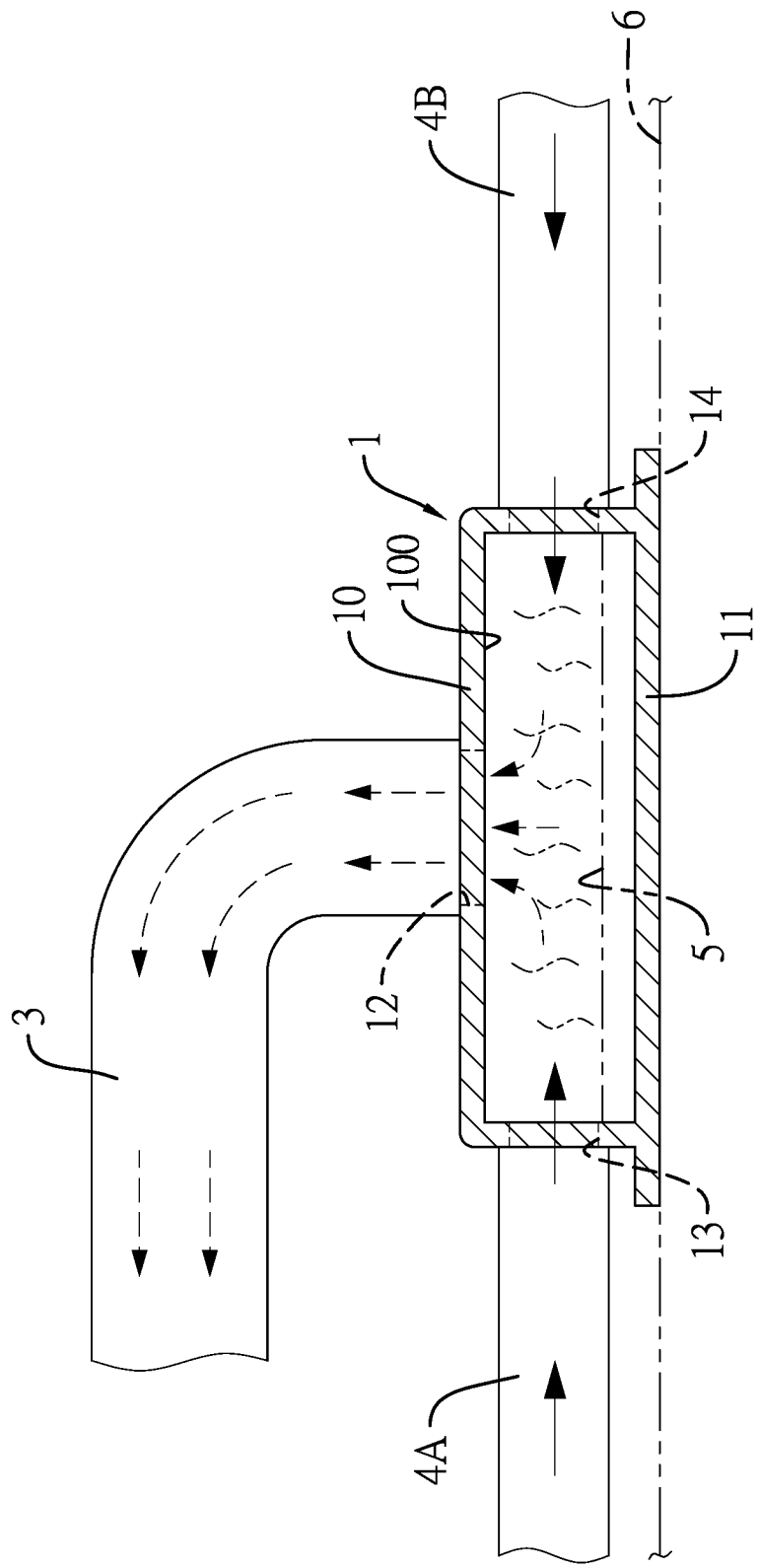
FIG. 2 is a side view in partial section of an evaporator of the refrigerant heat dissipating apparatus in FIG. 1, shown mounted on a heat source.

With reference to FIGS. 1 and 2, an embodiment of a refrigerant heat dissipation apparatus comprises an evaporator 1, a condenser 2, a first refrigerant tube 3, and two second refrigerant tubes 4A, 4B, and an appropriate amount of refrigerant 5. The amount of the evaporator 1 is not limited to one. The amount of the evaporator 1 depends on the desired heat dissipating effect. In addition, the amount of the first refrigerant tube 3 and the second refrigerant tubes 4A, 4B vary with the amount of the evaporator 1. The first refrigerant tube 3 and the second refrigerant tubes 4A, 4B are connected between the evaporator 1 and the condenser 2, so as to form a multi-flow closed-loop cycle. The refrigerant 5 may flow in the multi-flow closed-loop cycle.

With reference to FIGS. 1 and 2, the evaporator 1 comprises a body 10, an evaporation chamber 100 inside the body 10, a heat conducting element 11 disposed at the bottom of the body 10, a refrigerant exit 12 at the top of the body 10, and two refrigerant entrances 13, 14 disposed at two side surfaces of the body 10 respectively. The body 10 is made of heat conductive material. The heat conducting element 11 is plate-like. The side surfaces of the body 10 are disposed at a height lower than the refrigerant exit 12 and at two opposite sides of refrigerant exit 12. The refrigerant exit 12 and the refrigerant entrances 13, 14 communicate with the evaporation chamber 100. An entrance area of each of the refrigerant entrances 13, 14 is less than an exit area of the refrigerant exit 12.

With reference to FIG. 1, the condenser 2 comprises a first condensing tube 20A, a second condensing tube 20B, multiple heat dissipating tubes 21, and multiple heat dissipating elements 22. Each of the first condensing tube 20A and the second condensing tube 20B comprises a condensing chamber inside. The first condensing tube 20A and the second condensing tube 20B are arranged along a horizontal direction and spaced at an interval. The heat dissipating tubes 21 are made of heat conductive material. The heat dissipating tubes 21 are arranged from top to down. The heat dissipating tubes 21 arranged from top to down are connected between the first condensing tube 20A and the second condensing tube 20B. The heat dissipating elements 22 are distributed on outer surfaces of the heat dissipating tubes 21 and thermally contact the outer surfaces of the heat dissipating tubes 21. In an embodiment, as shown in FIG. 1, the heat dissipating elements 22 contact the outer surfaces of the heat dissipating tubes 21 for direct heat conduction. In an embodiment, the heat dissipating elements 22 contact the outer surfaces of the heat dissipating tubes 21 for direct heat conduction; specifically, the heat dissipating elements 22 contact the outer surfaces of the heat dissipating tubes 21 via a heat conducting substance for heat conduction. The heat conducting substance may be, but is not limited to, a thermal grease.

As shown in FIG. 1, each of the heat dissipating elements 22 is an element having a large heat dissipating area, such as a wavy sheet.

With reference to FIGS. 1 and 2, an inner diameter of the first refrigerant tube 3 is larger than an inner diameter of each of the second refrigerant tubes 4A, 4B. The first refrigerant tube 3 comprises two ends connected with the refrigerant exit 12 and an upper part of the first condensing tube 20A respectively. Each of the second refrigerant tubes 4A, 4B comprises a first terminal connected with each of the refrigerant entrances 13, 14 and a second terminal opposite to the first terminal. The second terminals of the second refrigerant tubes 4A, 4B are respectively connected with a lower part of the first condensing tube 20A and a lower part of the second condensing tube 20B. Accordingly, the evaporator 1, the condenser 2, the first refrigerant tube 3, and the second refrigerant tubes 4A, 4B are connected to form a multi-flow closed-loop cycle. The refrigerant 5 is filled into the multi-flow closed-loop cycle.

Figure 3:
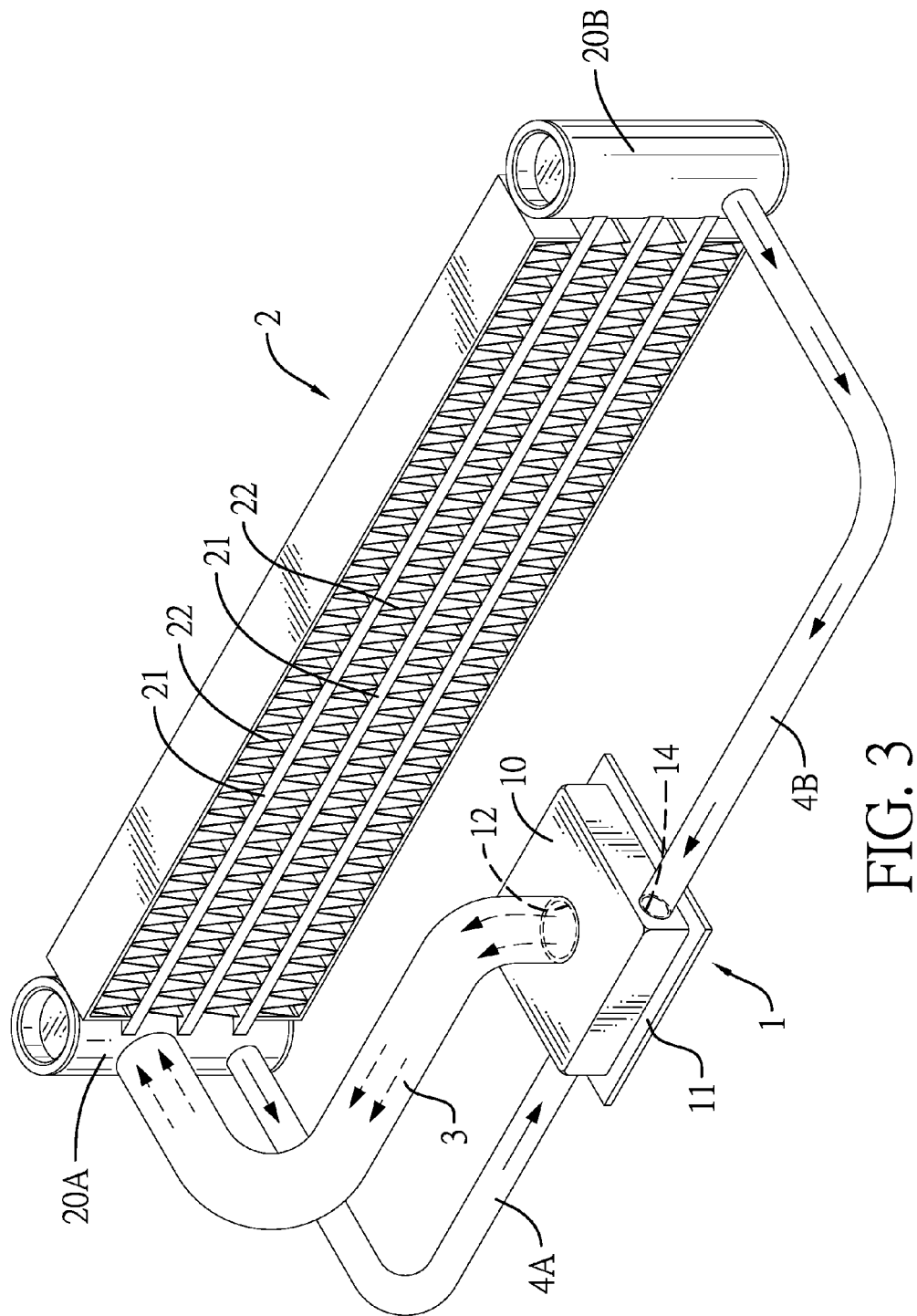
FIG. 3 is an operational view of the refrigerant heat dissipating apparatus in FIG. 1.

With reference to FIGS. 2 and 3, the heat conducting element 11 of the refrigerant heat dissipating apparatus thermally contacts a heat source 6 of an electronic device to cool down the electronic device. The heat generated, by the heat source 6 is conducted to the refrigerant 5 within the evaporation chamber 100 by the heat conducting element 11. The refrigerant 5 within the body 10 absorbs heat and is transformed from liquid state to gaseous state. Since the entrance area of each of the refrigerant entrances 13, 14 is less than the exit area of the refrigerant exit 12 and the inner diameter of each of the second refrigerant tubes 4A, 4B is less than an inner diameter of the first refrigerant tube 3, the refrigerant 5 in gaseous state in the evaporator 1 may flow toward the refrigerant exit 12 and the first refrigerant tube 3 based on the principle that hot air rises and the Bernoulli's principle.

With reference to FIGS. 2 and 3, when the refrigerant 5 in gaseous state flows from the evaporator 1 to the first condensing tube 20A via the refrigerant exit 12 and the first refrigerant tube 3, a part of the refrigerant 5 in gaseous state may be transformed into liquid state because that part of the refrigerant 5 flows away from the heat source 6 and cools down, thereby forming a first refrigerant liquid flow. The first refrigerant liquid flow may flow down along the first condensing refrigerant tube 20A and flow back to the evaporator 1 via the second refrigerant tube 4A to absorb heat again. The rest of the refrigerant 5 in gaseous state entering into the first condensing tube 20A may flow into the second condensing tube 20B via the heat dissipating tubes 21. When the rest of the refrigerant 5 in gaseous state flow into the heat dissipating tubes 21, the rest of the refrigerant 5 in gaseous state is cooled down quickly under the heat dissipating effects of the heat dissipating tubes 21 and the heat dissipating elements 22, so as to condense the rest of the refrigerant 5 in gaseous state into liquid state and forms a second refrigerant liquid flow. The second refrigerant liquid flow may flow down along the second condensing tube 20B and flow back to the evaporator 1 via the second refrigerant tube 4B to absorb heat again.

Since the part of the refrigerant 5 in gaseous state transformed into liquid state when passing through the first refrigerant tube 3 is allowed to flow back to the evaporator 1 without passing through the heat dissipating tubes 21 and the second condensing tube 20B in the multi-flow closed-loop cycle, the refrigerant heat dissipating apparatus may dissipate heat with high efficiency.

What is claimed is:

1. A refrigerant heat dissipation apparatus comprising:
   an evaporator comprising:
      a body;
      an evaporation chamber disposed within the body;
      a heat conducting element disposed at a bottom of the body;
      a refrigerant exit at a top of the body and communicating with the evaporation chamber; and
      two refrigerant entrances disposed at two side surfaces of the body respectively and communicating with the evaporation chamber, wherein the side surfaces are disposed at a height lower than the refrigerant exit and at two opposite sides of the refrigerant exit, and an entrance area of each of the refrigerant entrances is less than an exit area of the refrigerant exit;
   a condenser comprising:
      a first condensing tube and a second condensing tube arranged along a horizontal direction and spaced at an interval;
      multiple heat dissipating tubes arranged from top to down and connected between the first condensing tube and the second condensing tube; and
      multiple heat dissipating elements distributed on outer surfaces of the heat dissipating tubes and thermally contacting the outer surfaces of the heat dissipating tubes;
   a first refrigerant tube comprising two ends connected with the refrigerant exit and an upper part of the first condensing tube respectively;
   two second refrigerant tubes, each of the second refrigerant tubes comprising:
      an inner diameter less than an inner diameter of the first refrigerant tube;
      a first terminal connected with each of the refrigerant entrances; and
      a second terminal opposite to the first terminal, wherein the second terminals of the second refrigerant tubes are respectively connected with a lower part of the first condensing tube and a lower part of the second condensing tube, so as to form a multi-flow closed-loop cycle by the evaporator, the condenser, the first refrigerant tube and the second refrigerant tubes; and
   a refrigerant filled into the multi-flow closed-loop cycle.

2. The refrigerant heat dissipation apparatus as claimed in claim 1, wherein each of the heat dissipating elements is a wavy sheet.

* * * * *